US009460802B2

(12) United States Patent
Kandiraju et al.

(10) Patent No.: US 9,460,802 B2
(45) Date of Patent: *Oct. 4, 2016

(54) MAINTAINING VERSIONS OF DATA IN SOLID STATE MEMORY

(71) Applicant: International Business Machines Corporation, Armonk, NY (US)

(72) Inventors: Gokul B. Kandiraju, Tarrytown, NY (US); Hubertus Franke, Cortlandt Manor, NY (US); David Craft, Wimberly, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/800,024

(22) Filed: Jul. 15, 2015

(65) Prior Publication Data

US 2015/0318046 A1   Nov. 5, 2015

Related U.S. Application Data

(63) Continuation of application No. 13/494,723, filed on Jun. 12, 2012, now Pat. No. 9,116,793.

(51) Int. Cl.
*G06F 12/02* (2006.01)
*G11C 16/26* (2006.01)

(52) U.S. Cl.
CPC .......... *G11C 16/26* (2013.01); *G06F 12/0246* (2013.01); *G06F 2212/7209* (2013.01)

(58) Field of Classification Search
None
See application file for complete search history.

(56) References Cited

U.S. PATENT DOCUMENTS

| 6,289,356 | B1 | 9/2001 | Hitz et al. | |
| 7,395,384 | B2 | 7/2008 | Sinclair et al. | 711/156 |
| 7,694,105 | B2* | 4/2010 | Sanvido | G11B 20/1803 |
| | | | | 711/161 |
| 7,702,949 | B2 | 4/2010 | Erstad | |
| 7,752,381 | B2* | 7/2010 | Wong | G06F 12/0246 |
| | | | | 711/103 |

(Continued)

FOREIGN PATENT DOCUMENTS

| KR | 1041837 | 6/2011 |
| KR | 1041837 B1 | 6/2011 |
| WO | WO2011095516 | 8/2011 |

OTHER PUBLICATIONS

Non-Final Rejection dated Dec. 22, 2014, received for U.S. Appl. No. 13/615,867.

(Continued)

*Primary Examiner* — Tracy Chan
(74) *Attorney, Agent, or Firm* — Fleit Gibbons Gutman Bongini Bianco PL; Thomas S. Grzesik

(57) ABSTRACT

Various embodiments are directed to maintaining versions of data within a solid state memory. At least one request to write at least one dataset to a logical page of a solid state memory is received from a file system. At least one physical page in a data block of the solid state memory associated with the logical page is identified. A processor stores the dataset in the at least one physical page. At least one data versioning tag is associated with the at least one dataset in a data structure associated with the logical page. The data versioning tag identifies the at least one dataset as a given version of the logical page. The at least one dataset is maintained as accessible from the at least one physical page irrespective of subsequent write operations to the logical page in response to associating the at least one data versioning tag.

5 Claims, 9 Drawing Sheets

(56) References Cited

U.S. PATENT DOCUMENTS

| | | | |
|---|---|---|---|
| 7,836,029 B2 | 11/2010 | Shoens | |
| 7,970,987 B2 | 6/2011 | Conley | |
| 8,151,040 B2 | 4/2012 | Wong | 711/103 |
| 8,407,428 B2 | 3/2013 | Cheriton et al. | |
| 2005/0097298 A1 | 5/2005 | Cohen | 711/206 |
| 2005/0097398 A1 | 5/2005 | Day et al. | |
| 2006/0020744 A1 | 1/2006 | Sinclair et al. | |
| 2008/0282024 A1 | 11/2008 | Biswas et al. | 711/103 |
| 2010/0250840 A1 | 9/2010 | Wong | |
| 2011/0126045 A1 | 5/2011 | Bennett | |
| 2011/0219168 A1 | 9/2011 | Stephens | |
| 2011/0238888 A1* | 9/2011 | Chiu | G06F 3/0607 711/103 |
| 2012/0096217 A1 | 4/2012 | Son et al. | 711/103 |
| 2012/0191664 A1* | 7/2012 | Wakrat | G06F 12/0246 707/684 |
| 2013/0282999 A1 | 10/2013 | Bennett | 711/162 |

OTHER PUBLICATIONS

Non-Final Rejection dated Dec. 18, 2014, received for U.S. Appl. No. 13/494,697.
Non-Final Rejection dated Jan. 15, 2015, received for U.S. Appl. No. 13/615,885.
Non-Final Rejection dated Jan. 5, 2015, received for U.S. Appl. No. 13/494,784.
Non-Final Rejection dated Jan. 2, 2015, received for U.S. Appl. No. 13/615,908.
Non-Final Rejection dated Jan. 23, 2015, received for U.S. Appl. No. 13/494,796.
Non-Final Rejection dated Feb. 3, 2015, received for U.S. Appl. No. 13/615,945.
Final Rejection dated Aug. 4, 2014 received for U.S. Appl. No. 13/494,697.
Final Rejection dated Aug. 6, 2014 received for U.S. Appl. No. 13/615,945.
Final Rejection dated Aug. 6, 2014 received for U.S. Appl. No. 13/494,796.
Final Rejection dated Aug. 5, 2014 received for U.S. Appl. No. 13/615,908.
Final Rejection dated Aug. 4, 2014 received for U.S. Appl. No. 13/494,784.
Final Rejection dated Aug. 6, 2014 received for U.S. Appl. No. 13/615,885.
Final Rejection dated Aug. 4, 2014 received for U.S. Appl. No. 113/494,697.
Final Rejection dated Jul. 31, 2014 received for U.S. Appl. No. 13/615,867.
Gal et al., Algorithms and Data Structures for Flash Memories, ACM Computing Surveys, vol. 37, No. 2, Jun. 2005.
Park, S., et al., "Atomic Write FTL for Robust Flash File System", Proceedings of the Ninth International Symposium on Consumer Electronics, Jun. 2005 , 155-160. Digital Object Identifier :10.1109/ISCE.2005.1502361.
Lim, S., et al., "Journal Remap-Based FTL for Journaling File System with Flash Memory", High Performance Computing and Communications, Sep. 2007, pp. 192-203, Lecture notes in Computer Science vol. 4782. DOI10.1007/978-3-540-75444-2__23.
Non Final Rejection dated Mar. 28, 2014, received for U.S. Appl. No. 13/494,784.
Non Final Rejection dated Apr. 11, 2014, received for U.S. Appl. No. 13/615,908.
Non Final Rejection dated Mar. 31, 2014, received for U.S. Appl. No. 13/494,796.
Non Final Rejection dated Mar. 28, 2014, received for U.S. Appl. No. 13/615,945.
Non Final Rejection dated Mar. 12, 2014, received for U.S. Appl. No. 13/494,697.
Non Final Rejection dated Mar. 14, 2014, received for U.S. Appl. No. 13/615,885.
Non Final Rejection dated Apr. 21, 2014, received for U.S. Appl. No. 13/615,867.
Chung et at., "A Survey of Flash Translation Layer", 2009, Journal of Systems Architecture 55, pp. 332-343.
Gal et al., "Algorithms and Data Structures for Flash Memories", Jun. 2005, ACM Computing Surveys, vol. 37, No. 2.
Wu, CH, et al., "An Adaptive Flash Translation Layer for High-Performance Storage Systems," IEEE Transactions on Computer-Aided Design of Integrated Circuits and Systems, vol. 29, No. 6, Jun. 2010.

* cited by examiner

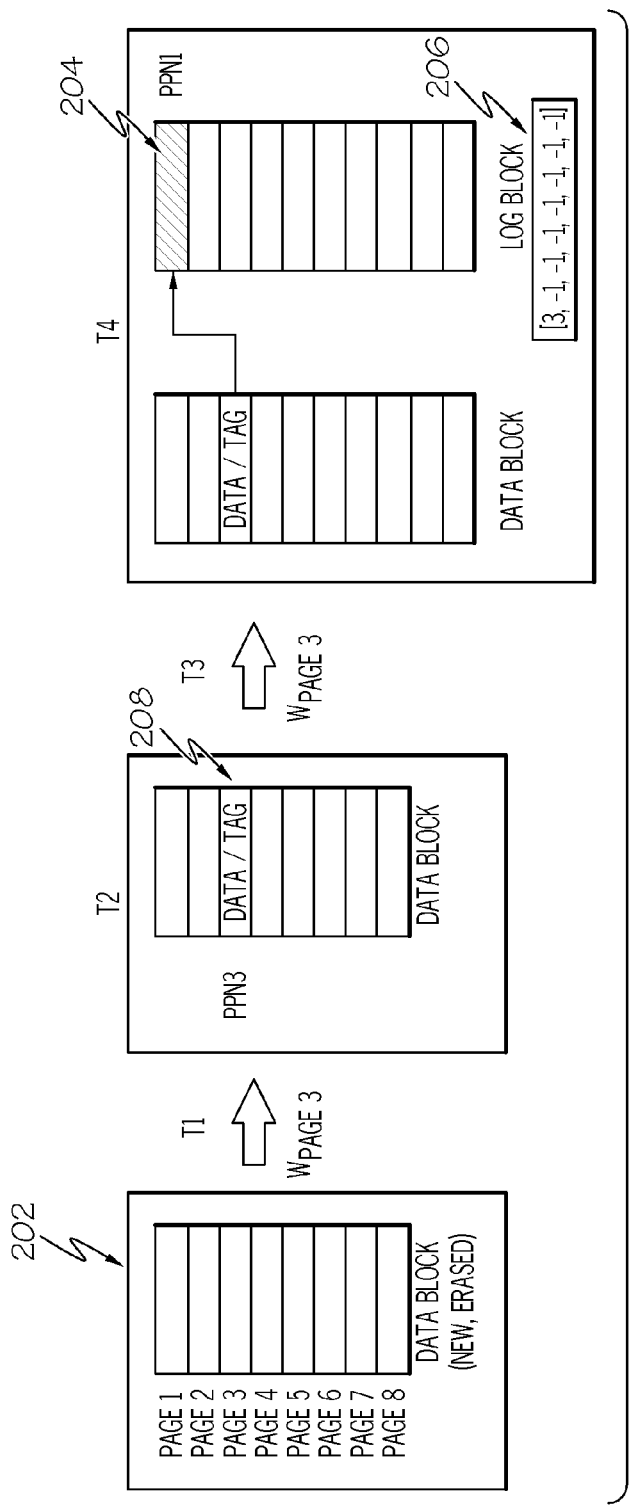
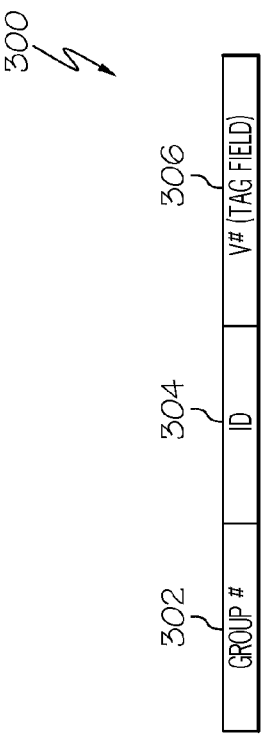
FIG. 2
FIG. 3

MAINTAINING VERSIONS OF DATA IN SOLID STATE MEMORY

CROSS-REFERENCE TO RELATED APPLICATION

This application claims priority from U.S. application Ser. No. 13/494,723, now U.S. Pat. No. 9,116,793, entitled "Maintaining Versions Of Data In Solid State Memory" filed on Jun. 12, 2012, which is hereby incorporated by reference in its entirety.

This application is related to the following applications entitled: "File System For Maintaining Data Versions In Solid State Memory", Ser. No. 13/494,784, now U.S. Pat. No. 9,122,582; "Flash Translation Layer System For Maintaining Data Versions In Solid State Memory", Ser. No. 13/494,796, now U.S. Pat. No. 9,135,161; and "Data Versioning In Solid State Memory", Ser. No. 13/494,697, now U.S. Pat. No. 9,122,581, all of which were filed on Jun. 12, 2012 and are commonly assigned herewith to International Business Machines Corporation. These related applications are herein incorporated by reference.

This application is also related to the following applications entitled: "Maintaining Versions Of Data In Solid State Memory", Ser. No. 13/615,885, now U.S. Pat. No. 9,135,163; "File System For Maintaining Data Versions In Solid State Memory", Ser. No. 13/615,908, now U.S. Pat. No. 9,122,584; "Flash Translation Layer System For Maintaining Data Versions In Solid State Memory", Ser. No. 13/615,945, now U.S. Pat. No. 9,229,852; and "Data Versioning In Solid State Memory", Ser. No. 13/615,867, now U.S. Pat. No. 9,135,162, all of which were filed on Sep. 14, 2012.

BACKGROUND

Embodiments of the present invention generally relate to data versioning, and more particularly relate to data versioning in solid state memory.

Solid state memory, such as flash memory, is becoming increasingly popular for storing data. For example, solid-state Disks (SSDs) that implement flash memory are emerging as an important candidate in the market for data storage (both for file-systems and otherwise). While SSDs provide efficient read access, writes are more complex because in-place updates are generally not possible in current solid state memories. Therefore, SSD vendors normally ship SSDs with a layer referred to as the Flash Translation Layer (FTL) that remaps every write to a different block and exposes an SSDs as a standard block device (e.g., a hard disk drive).

BRIEF SUMMARY

In one embodiment, a method for maintaining versions of data within a solid state memory is disclosed. The method comprises receiving, from a file system, at least one request to write at least one dataset to a logical page of a solid state memory. At least one physical page in a data block of the solid state memory associated with the logical page is identified. A processor stores the at least one dataset in the at least one physical page. At least one data versioning tag is associated with the at least one dataset in a data structure associated with the logical page. The at least one data versioning tag identifies the at least one dataset as a given version of the logical page. The at least one dataset is maintained as accessible from the at least one physical page irrespective of subsequent write operations to the logical page in response to associating the at least one data versioning tag.

BRIEF DESCRIPTION OF THE SEVERAL VIEWS OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which:

FIG. 2 is a transactional diagram illustrating one example of writing data to a solid state memory according to one embodiment of the present invention.

FIG. 3 shows one example of a data versioning tag according to one embodiment of the present invention;

DETAILED DESCRIPTION

Operating Environment

Figure 1:
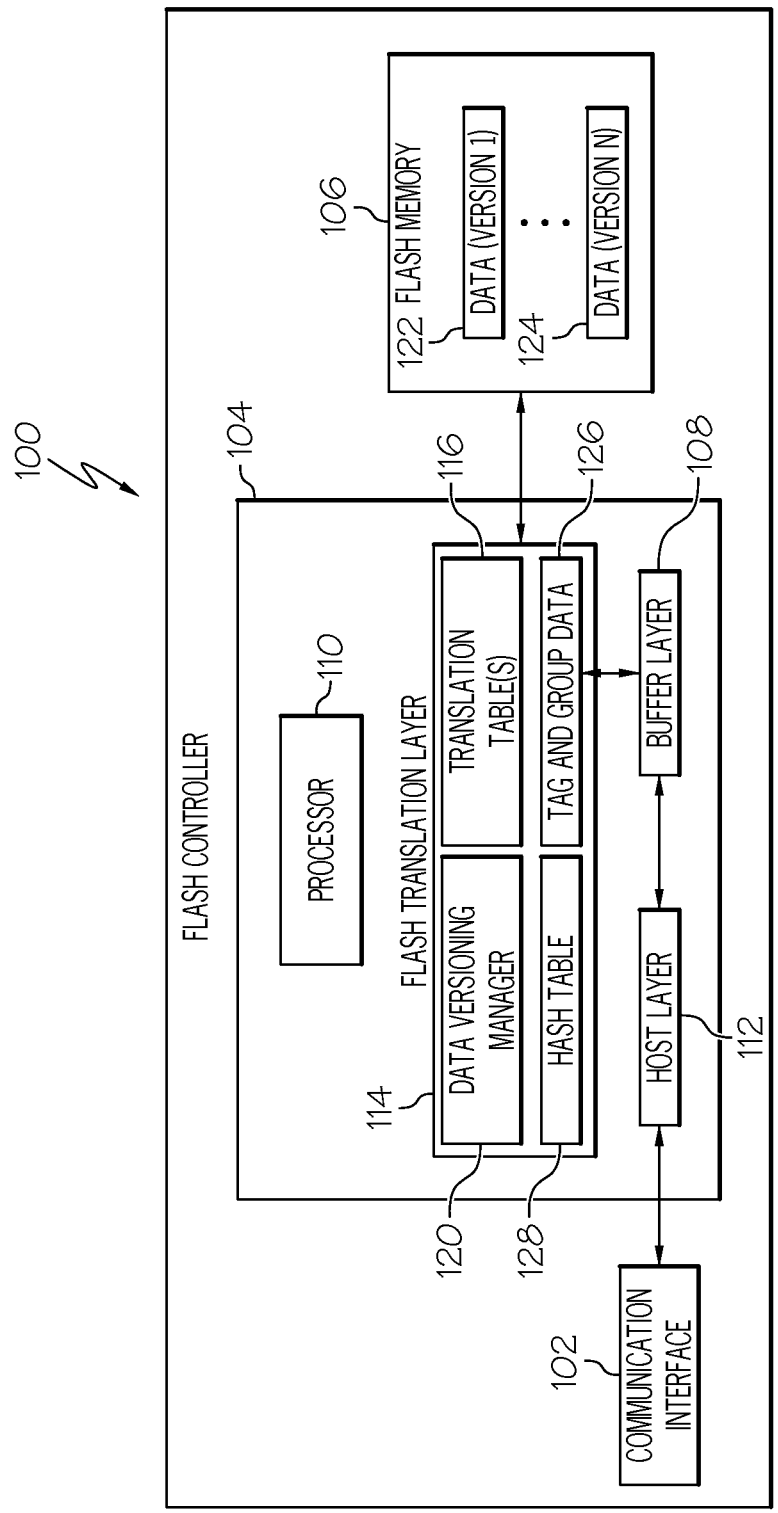
FIG. 1 is a block diagram illustrating one example of an operating environment according to one embodiment of the present invention.

FIG. 1 shows one example of an operating environment 100 according to one embodiment of the present invention. In this embodiment, the operating environment 100 is a solid state memory based storage system 100 such as, but not limited to, a solid-state disk (SSD) implementing flash memory. Solid-state disks or drives are data storage devices that persistently store data on solid-state memory within the device. SSDs typically provide access to their stored data in the same manner as traditional block I/O hard disk drives. The storage system 100, in one embodiment, at least comprises a communication interface 102, a flash controller 104, and solid state memory (flash memory) 106. The communication interface 102 allows external devices such as information processing systems and networking devices to interface with the storage system 100. The communication interface 102 can implement one or more communication protocols such as, but not limited to, Serial Advanced Technology Attachment (SATA), Universal Serial Bus (USB), Small Computer System Interface (SCSI), and/or the like.

The flash controller 104 controls the transfer of data between the flash memory 106 and external devices coupled to the communication interface 102. The flash controller 104 can also be coupled to other memory such as random access memory (RAM) buffers within a buffer layer 108. This memory can act as a cache for a processor 110 of the system 100 and/or a read/write buffer between the flash memory 106 and the communication interface 102. The flash controller 104, in this embodiment, comprises the processor 110 that can include software and/or firmware for performing various operations such as, but not limited to, logical-to-physical translation operations, wear-leveling, garbage-collection, data versioning operations, and/or the like. The flash controller 104 also includes a host layer 112 and the buffer layer 108. The host layer 112 controls the flow of data between the flash controller 104 and the communication interface 102. The buffer layer 108 manages the buffering of data between the flash memory 106 and the communication interface 102 in one or more memory buffers.

The flash controller 104 further comprises a flash translation layer (FTL) 114 that can be implemented as software, hardware, or a combination thereof within the flash controller 104 and the processor 110. The FTL 114 is coupled to one or more file systems 115 on a host system (not shown). Standard file-systems, as well as, Redirect-on-Write (RoW) and Copy-on-Write (CoW) file-systems run on top of the storage system 100 by using it as any ordinary block device. In some embodiments, the FTL 114 is embedded into the file system where the file-system, in addition to its normal, functionality, also comprises functionality of the FTL. These types of file systems are referred as flash file systems.

The FTL 114 performs logical-to-physical (and physical-to-logical) address translation for data stored within the flash memory 106. The FTL 114 maintains this mapping within one or more logical-to-physical (L2P) translation tables 116. The FTL 114, in one embodiment, also comprises a data versioning manager 120. The data versioning manager 120 maintains and stores multiple versions 122, 124 of data within the flash memory 106. Tag/group data 126 and one or more hash tables 128 for accessing the tag/group data 126 is maintained by the data versioning manager 120 for providing versioning mechanisms within the flash memory 106. The data versioning manager 120, tag and group data 126, and hash tables 128 are discussed in greater detail below.

Data Versioning in Solid State Memory

As discussed above, the FTL 114 provides a data versioning mechanism(s) within the flash memory 106. This is advantageous over conventional flash memory based storage systems, since conventional storage systems generally do not provide any type of data versioning. This is because one characteristic of flash memory is that it does not support overwriting in place. For example, FIG. 2 shows one example of how data versioning can be provided in flash memory 106 according to one embodiment of the present invention. In the example of FIG. 2, a log structure is utilized by the FTL 114 when writing data to the flash memory 106. However embodiments of the present invention are not limited to such as example. FIG. 2 shows an empty data block 202 comprising 8 physical pages within the data block. It should be noted that FIG. 2 only shows a portion of the physical pages within the data block 202 The FTL 114, at T1, receives a request from the file system 115 to write data to a given logical page number LPN3. The FTL 114 analyzes the translation table 116 to identify which physical page number in the data block 202 the data should be written to. In the current example, the FTL 114 determines that physical page number PPN3 is erased (free to be written). The FTL 114 then proceeds to write the data to PPN3, at T2 and marks PPN3 as 'valid'.

The FTL 114, at T3, receives a subsequent request from the file system 115 to write data to LPN3. The FTL 114 once again analyzes the translation table 116, which currently maps LPN3 to PPN3. This indicates that data has been previously written for LPN3 in PPN3. Because flash memory does not support overwriting in place, the FTL 114 needs to write the new data for LPN3 in a new physical page, such as that in a clean erase block 204 (e.g., log block), as shown in FIG. 2. A table or an array 206 is maintained by the FTL 114 for the log block 204 where each position in the array corresponds to a physical page in the log block 204. For example, FIG. 2 shows that the subsequent write request for LPN3 resulted in the FTL 114 writing the new data to physical page number PPN1 of the log block, at T4. The first position of the array 206 was updated to "3" to indicate that the first physical page PPN1 of the log block corresponds to logical page number LPN3. In the current example, a "−1" in the array 206 indicates that the corresponding physical page in the log block 204 is erased (i.e., can be written to). However, any type of notation or bit can be used to provide this indication.

With respect to the previously written to physical page PPN3 in the data block 202, conventional flash based storage systems would invalidate this physical page. This invalidated page is marked for garbage collection, which recycles invalidated physical pages, consolidates the valid pages into a new erase block, and cleans the old erase block. However, the FTL 114 of one or more embodiments prevents the previous physical page PPN3 from being invalidated and associates a data versioning tag 208 (herein referred to as "tag") with physical page PPN3. The tag 208 indicates that this physical page PPN3 and its data are to be maintained/saved and not sent for garbage collection.

One example of a data versioning tag is shown in FIG. 3. In this example, a tag 200 comprises a tag group number field 302, an ID field 304, and a tag field 306. The tag group number field 302 comprises the tag group number assigned to a physical page by the file system 115. A tag group is a collection of logical page numbers and their associated physical pages. File systems typically manage user data by internally differentiating the blocks as data blocks, indirect blocks, and inode blocks. Data blocks generally contain user data. Indirect blocks contain pointers to the data blocks (and to other indirect blocks). An inode block corresponds to a file or a directory in the file-system, where a tree of indirect blocks usually arises from an inode block to finally reach out to the data blocks. Therefore, in one embodiment, the file system 115 assigns a different tag group to inode blocks, indirect blocks, data blocks, and special blocks.

In one embodiment of the invention, the ID field 304 comprises an identifier of a file or directory to which the data in the physical page of the flash memory 106 is associated with. As discussed above each time the file system 115 requests a write to the same logical page the FTL 114 writes the data to a new physical page. Therefore, the FTL 114 associates the ID 304 to each physical page associated with the same logical page and also associates this ID to the logical page as well. The tag field 306 can comprise any type of information, such as a version number, to be associated with the data of the physical page. A version number indicates what version of the data associated with the logical page (which can comprise multiple physical pages) is within each physical page associated with tag. In one embodiment, the tag 300 is only 8 bytes, but is not limited to such an example.

Figure 4:
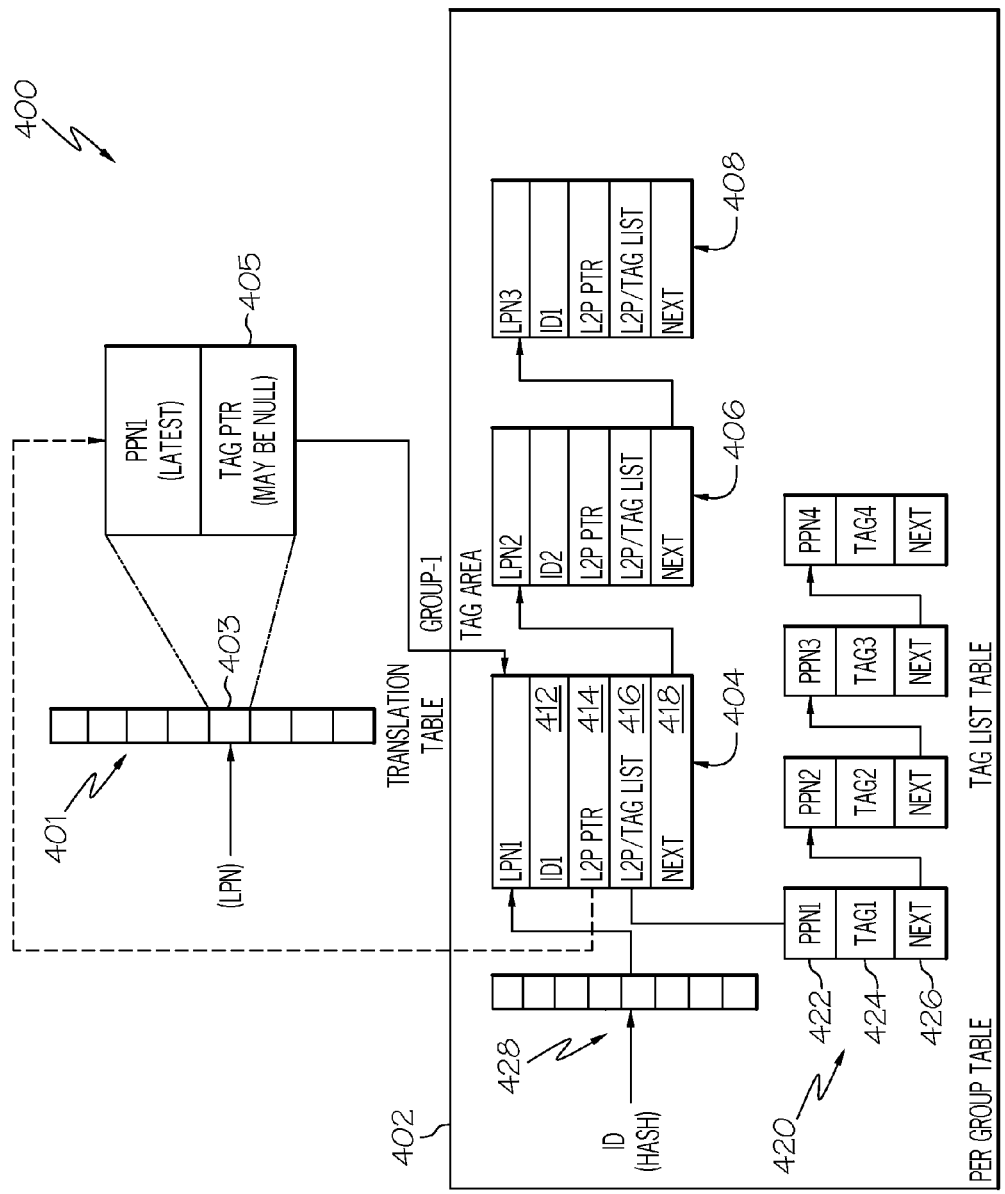
FIG. 4 shows one example of tag and group data structures for maintain versions of data within solid state memory according to one embodiment of the present invention.

The tag and group information 126 is associated with physical and logical pages. The tag and group information 126 comprises data structures for allowing versions of data to be maintained within the flash memory 106, and to also allow versioning operations such as snapshot and rollback. A data structure can comprise one or more tables, lists (e.g., linked lists) for storing the tag and group information 126. A single data structure can be used to store the tag and group information 126 or multiple data structures can be used. In addition, a single data structure can comprise one or more additional data structures. For example, FIG. 4 shows one example of how the FTL 114 maintains tag and group information for providing data versioning with flash memory. In particular, FIG. 4 shows that the tag and group information 400 comprises a group table 402 for each group associated with the file system 115. The group table 402 comprises tag areas 404, 406, 408 for each logical page associated with the group. A tag area 404 comprises an entry 410 with the logical page number of the logical page associated with the group table entry 404, an entry 412 with the ID (as obtained from the tags associated with the physical pages of the logical page) associated with the logical page, an entry 414 with a logical-to-physical (L2P) pointer, an entry 416 with a tag list pointer, and an entry 418 with a pointer to the next item in the list (if one exists). The L2P pointer points to the L2P entry 403 within the translation table 401 for the logical page. This L2P pointer, in on embodiment, is utilized when group operations (discussed later) are performed with special IDs (to denote all the files/directories) where, when entries in the tag list are modified (for example during a rollback or deletion etc.), the corresponding L2P entry may need to be updated.

Figure 5:
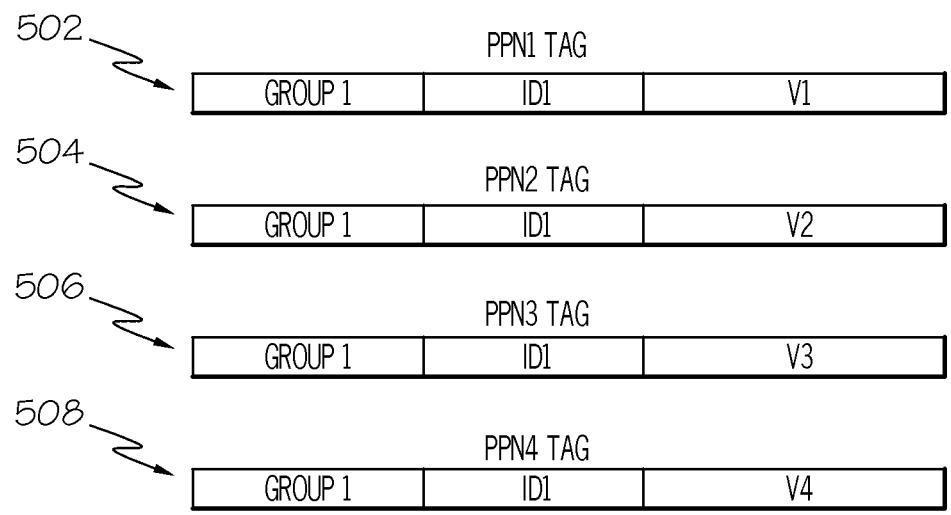
FIG. 5 shows examples of data versioning tags for different physical pages of a given logical page according to one embodiment of the present invention.

The tag list pointer points to a tag list 420 (within the group table 402) that is associated with the given logical page. A tag list 420 identifies each physical page associated with the logical page and also includes the tag (or tag information) of each physical page. For example, FIG. 4 shows that, for each physical page associated with logical page LPN1, the tag list 420 comprises an entry 422 identifying the physical page number, an entry 424 with the tag associated with the physical page, and an entry 424 with a pointer to the next entry in the tag list 420 for the next physical page associated with the logical page. FIG. 5 shows one example of the tags 502, 504, 506, 508 associated with physical pages PPN1, PPN2, PPN3, and PPN4 of logical page LPN1 in the group table 402. As can be seen, the tag 502, 504, 506, 508 of each physical page comprises the same group number, Group1, since each physical page is part of the same group, Group1. Each tag 502, 504, 506, 508 also includes the same ID, ID1, since the physical pages PPN1, PPN2, PPN3, and PPN4 are all part of the same inode (i.e., file or directory). The tags 502, 504, 506, 508 each have different version numbers since each physical page PPN1, PPN2, PPN3, and PPN4 comprises a different version of the data associated with the logical page. In one embodiment, the higher the version number the more recent the version. However, other configurations are applicable as well.

Returning to FIG. 4, the FTL 114, in one embodiment, maps the logical/physical pages to the group table 402 by including a pointer to the tag area 404 within the translation table 401. For example, FIG. 4 shows a translation table 401 comprising a plurality of entries. Each entry 403 identifies a logical page, such as LPN1 and the most recent physical page, such as PPN1, to which data for the logical page has been written to. In addition, each entry 403 also comprises a tag pointer 405 that points to the tag area 404 of the group table 402 associated with the logical page. It should be noted that the tag pointer can be a null pointer, which indicates that data versioning has not been activated for this logical page and conventional translation operations are to be performed. In other words, an entry for the logical page does not exist within the tag area 404. In addition to the tag pointer 405 being maintained within the translation table 401, a hash table 428 can also be maintained by the FTL 114 to provide access to the tag areas 404 of the group table 402. For example, the hash table 428 can be used by the FTL 114 to identify tag areas 404 for a given logical page based on the ID associated therewith.

The above configuration of the tag and group data 126 allows the FTL 114 to maintain and store multiple versions of data within the flash memory 106. As noted above, physical pages that are tagged are prevented from being invalidated and marked for garbage collection. The above configuration also allows for the file system to perform tagged reads/writes and data versioning operations such as snapshot operations and rollback operations. It should be noted that a file system 115 is able to activate and deactivate data versioning within the flash memory 106. In addition, the above configuration allows the file systems 115 of a flash device to perform various operations associated with data versioning such as creating snapshots, performing rollback operations, and the like. The FTL 114 also provides tagged operations to the file system 115 that allow data versioning to be performed at an individual block level, file level, or a file-system level. These tagged operations are discussed in greater detail below.

The following is a more detailed discussion on how a file system 115 interacts with the FTL 114 to perform tagged read/writes and data versioning operations. As discussed, the file system 114 of one embodiment reserves a given number of groups in the flash memory and uses these groups in tagged operations such as tagged reads and tagged writes. In one embodiment, the file system 115 uses a first group for tagged operations with respect to inodes, a second group for tagged operations with respect to indirect blocks, a third group for tagged operations with respect to data blocks, and a fourth group for tagged operations with respect to special blocks.

Special blocks are blocks used to maintain file-system specific metadata. For example, a file-system may use bitmaps to keep track of all the free blocks in the disk space. This information, in one embodiment, needs to be made persistent across system reboots. Therefore, a file-system can store this information in some blocks referred to as special blocks. Special blocks maintain pointers to these blocks from other blocks, such as the inode of the root or so called 'superblock', which itself would be a special block. It should be noted that additional groups or fewer groups can be utilized by the file system 115 as well. The file system 115 also uses the ID field of a tag discussed above to store the inode number of a file/directory. This enables the file system 115 to manage the versioning operations at a file/directory level efficiently. Therefore, the file system 115, in one embodiment, maps the individual file/directories and their associated blocks (data/indirect/inode) into groups and IDs provided by the FTL 114 for efficient file-system level and file-level versioning operations.

In one embodiment, the file system 115 sends a tagged write request to the FTL 114 in the form of WRITE(DATA, BLK#, TAG). The DATA variable comprises the data to be written. The BLK# variable comprises the block number (logical page number) that the data is to be written to. The TAG variable comprises the tag to be associated with the physical page of the flash memory 106. As discussed above, the tag comprises a group number associated with the logical page identified in the write request. The group number identifies if the write operation is to be performed on Group1 (inodes), Group2 (indirect blocks), Group3 (data blocks), Group4 (special blocks), etc. The tag also comprises the ID of the file/directory (e.g., inode) associated with the data to be written and the version number of the data.

When a tagged write request such as WRITE (DATA_XYZ, LPN3, (Group1, ID1, V2) is received, the FTL 114 analyzes the write request and identifies the logical page number to which the data is to be written to. For example, in the current example, the FTL 114 determines that the file system is requesting to write data DATA_XYZ to logical page number LPN3, similar to the example given above with respect to FIG. 2. The FTL 114 then analyzes the L2P translation table 116 to identify a physical page within the flash memory that corresponds to the logical page LPN3. As noted above, the physical page identified in the translation table 116 is most recent physical page to which data has been written to for the logical page. In the current example, the translation table 116 currently maps LPN3 to physical page number PPN1. Therefore, The FTL writes the data to physical page PPN2 (next erased/free page) in the flash memory block associated with LPN3. The FTL 114 also updates the translation table 116 to map logical page LPN3 to physical page PPN2.

In addition, the FTL 114 analyzes the tag to update the tag and group data 126 accordingly for logical page LPN3 and physical page PPN2. In the current example, the tag in the write request WRITE (DATA_XYZ, LPN3, TAG) is (Group1, ID1, V2). Therefore, because the tag is populated (non-null) the file system 115 is requesting data versioning to be performed. As discussed above, the FTL 114 prevents any of the pages comprising previously written data for the logical page from being invalidated by associating a tag therewith. Stated differently, the FTL 114 saves these pages and their data for data versioning. Using the tag pointer in the translation table 116, the FTL 114 identifies the tag area 404 associated with the logical page LPN3. The FTL 114 then analyzes the tag area 404 to identify the tag list pointer for locating the tag list 420 associated with LPN3. Once the tag list 420 is located, the FTL 114 updates the tag list 420 by adding a tag list entry for the physical page just written to. For example, the FTL 114 adds a tag list entry for physical page number PPN2 that is mapped to the tag area entry for logical page number LPN1. As discussed above, this tag list entry identifies the physical page number PPN2 and also includes the tag (Group1, ID1, V2), which indicates that physical page number PPN2 is associated with file/directory ID1 in Group1 and is the second version (V2) of the data associated with file/directory ID1. In one embodiment, the entries in the tag list 420 are organized with the most recent written to physical page being at the front of the list. However, other configurations are applicable as well.

It should be noted that the tag sent with the write request can be null. In this situation, if a tag area entry does not exist for the logical page (as determined based on the tag pointer in the translation table 116), conventional operations are performed where any previous written data for the logical page is invalidated and marked for garbage collection, and the translation table 116 is updated accordingly. Stated differently, data versioning is not performed when the tag is null. If the tag is a null tag and a tag area entry does exist for the logical page, the data is written to a new physical page and the translation table 116 is updated accordingly.

When the file system 115 wants to read the latest (most recent) version of a page, the file system 115 can send a read request to the FTL 114 in the form of READ(BLK#) where BLK# is the logical page number which the file system 115 wants to read. The FTL 114 analyzes the translation table 116 to identify the physical page corresponding to the logical page number indicated in the read request. The FTL 114 retrieves the data associated with the physical page and sends the data back to the file system 115. In addition, the FTL 114 can also retrieve the tag associated with the physical page from the tag and group data 126 and send the tag to the file system 115 as well. The FTL 114 is able to identify the tag based on the tag pointer within the translation table 115 for the logical page. The FTL 114 uses the tag pointer to locate the tag area 404 for the logical page and then retrieves the tag for the most recent physical page from the tag list 420.

In addition, the file system 115 can send a tagged read request to the FTL 114 in the form of READ(BLK#, TAG). This allows the file system 115 to specify a specific version of data for a logical page to be read. When the FTL 114 receives a tagged read request, the FTL 114 analyzes the translation table 116 to identify the tag pointer associated with the logical page identified within the tagged read request. The FTL 114 then locates the tag area 404 for the logical page in the group table 402 using the tag pointer. The FTL locates the tag list 420 for the logical page based on the tag list pointer within the tag area 402. The tag list 420 is analyzed to identify the physical page comprising a tag that matches the tag sent within the read request. The FTL 114 then returns the version of data stored in that physical page to the file system 115.

Associating the tags discussed above with physical pages also allows a file system 115 to perform snapshot and rollback operations at the block level, file level, and file-system levels. For example, with respect to performing snapshot operations of individual files, the file system 115 can send the FTL 114 freeze operations in the form of FREEZE(GROUP-DATABLKS, INODE#, V#), FREEZE (GROUP-INDIRECT, INODE#, V#), or FREEZE(GROUP-INODE, INODE#, V#). The first variable is the group number corresponding to data blocks, indirect blocks, and inode blocks, etc. The second variable is the ID or inode number discussed above. The third variable is the version number of the data in which the file system 115 is interested in. The file system 115 can also request snapshot operations with respect to the entire file-system. For example, the file system 115 can send the FTL 114 freeze requests in the form of FREEZE(GROUP-DATABLKS, −1), FREEZE(GROUP-INDIRECT, −1), FREEZE(GROUP-INODE, 1), where the first variable is similar to the first variable of the above freeze operation and the second variable indicates that the freeze operation is to be performed for all inodes.

When the FTL 114 receives a freeze request from the file system 114, the FTL 114 uses the group number and ID number within the freeze request to identify the appropriate tag and group data 126. For example, the group number is used to identify the appropriate group table 402. The FTL 114 identifies the appropriate tag area 404 within the group table 402 using the hash table 128. For example, the ID can be a hash and the hash table 128 can include an entry for this hash with a pointer to the associated tag area 404 for the given logical page. If the version number variable in the freeze request is null, the FTL 114 sets a "freeze" flag in the physical page comprising the most recent version of the data of logical page associated with the ID. In one embodiment, this 'freeze' flag is part of the tag list entry itself. If the version number is not null (i.e., the version number identifies a given version), the FTL 114 sets a "freeze" flag in the physical page comprising the version of data indicated in the freeze operation. If the ID in the freeze request is identified as a special case, e.g., −1, the FTL 114 performs the operations discussed above for each ID (i.e., inode) in the tag and group data 126. The FTL 114 can unfreeze the individual blocks, files, or the entire file system by submitting an unfreeze request comprising variables similar to the freeze operation discussed above.

The file system 115 can also request a rollback operation by submitting a request in the form of SHIFT(GROUP-DATABLKS, INODE#, V#), SHIFT(GROUP-INDIRECT, INODE#, V#), or SHIFT (GROUP-INODE, INODE#, V#). The variables of the shift request are similar to those discussed above with respect to the freeze operation. When the FTL 114 receives a shift request, the FTL 114 performs operations similar to those discussed above with respect to the freeze operation. However, the FTL sets the latest translation to the physical page number associated with version number within the shift request. The FTL 114 then moves the tag list entry associated with physical page comprising the version identified by the shift request to the beginning of the tag list 420. For example, consider an entry in the translation table 116 that indicates that current physical page with the most recent data is physical page number PPN4. The FTL 114 receives a shift request of SHIFT (GROUP1, ID1, V1). The FTL 114 rolls back the data for the logical page associated with ID1 to the first version (V1) of the data by updating the translation table 116 to point to the physical page (e.g., PPN1) associated with the first version of data. The FTL 114 also updates the tag list 420 to move the tag list entry for PPN1 to the beginning of the tag list 420.

The file system 115 can release pages that are being maintained for data versioning by submitting a release request to the FTL 114. The release request can comprise variables that are similar to the freeze operations discussed above. When the FTL receives a release request the FTL releases the tag (or all the tags for a special v#) associated with the group and ID (potentially the whole group) identified in the release request. After the release operation has been performed by the FTL 114, the released pages are ready for garbage collection.

As can be seen from the above discussion, one or more embodiments provide data versioning in the flash translation layer (FTL). The FTL keeps track of "older" versions for each physical page in the flash memory and supports snapshot and rollback operations. One or more embodiments also provide a file system that makes use of the versioning-FTL and provides block/file/file-system level data versioning in an efficient manner. Other embodiments, provide a protocol for interactions between the file system and FTL. The versioning operations such as snapshot/rollback are separated from the normal reads/writes. While the normal reads/writes are extended to have "tagged" reads/writes. Versioning operations do not need any data on the bus and are accomplished using freeze/unfreeze/shift protocol operations.

One advantage of the above aspects is that the FTL supports versioning operations with less traffic on the bus. Very few commands are needed to initiate the versioning operations. For example, the file system utilizes the tagged operations of the FTL discussed above to reduce the number of writes and provide efficient ways of versioning (and performing snapshot and rollback operations). For example, the file system can make use of the tagged operations and avoid the propagation to the root of the file system by writing new data with different tags (which creates a new version of the user data block alone). This reduces the number of I/O writes. Another advantage is that versioning can be enabled or disabled at an individual block level. This allows file system that do not support versioning to still interact with the FTL. A further advantage is that a fewer number of writes from a file-system perspective are required for writing data to the flash memory. For example, where a typical RoW/CoW file-system needs write propagation all the way to the root (in order to support consistent snapshots), one or more embodiments eliminate multiple redundant writes by providing ability to version at a much finer granularity (because of the FTL support). Another advantage is that the file system is provided with the flexibility to choose to version at individual block level, file-level or the whole file-system level. The file-system can also separate between metadata and data as desired.

Operational Flow Diagrams

Figure 6:
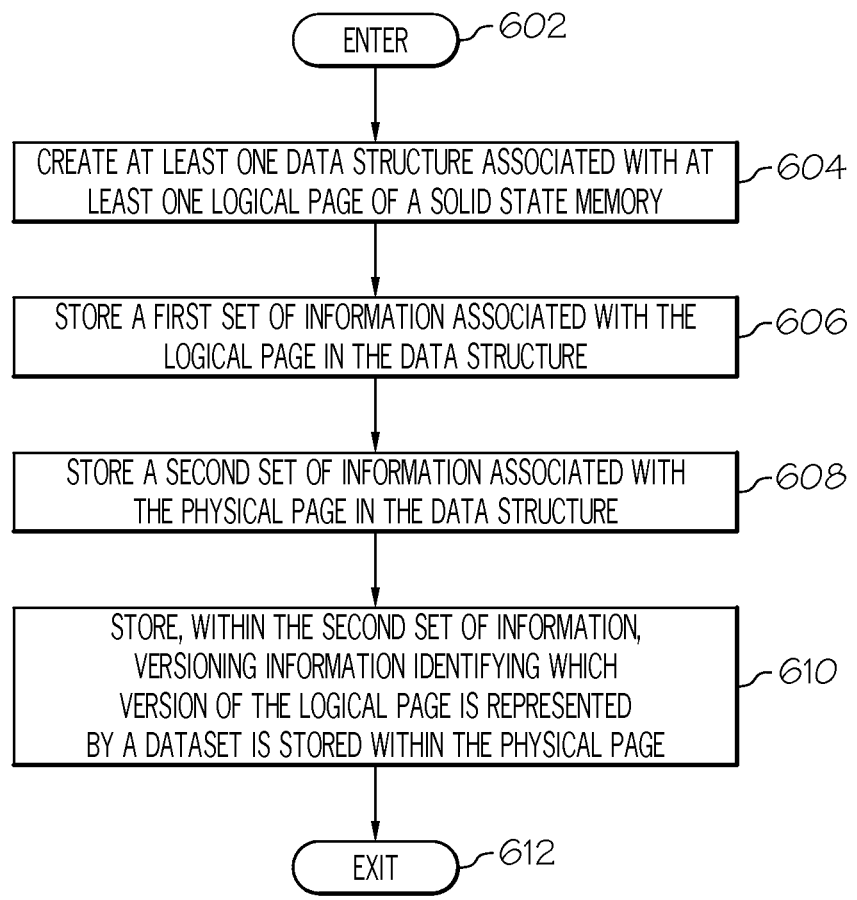
FIG. 6 is an operational flow diagram illustrating one example of a flash translation layer maintaining a data structure (tag and group information) for supporting data versions within a solid state memory according to one embodiment of the present invention.

FIG. 6 is an operational flow diagram illustrating one example of the flash translation layer 114 maintaining a data structure (tag and group information 126) for supporting data versions within a solid state memory 106. It should be noted that a more detailed discussion of the process shown in FIG. 6 has been given above with respect to FIGS. 1-5. The operational flow diagram of FIG. 6 begins at step 602 and flows directly to step 604. The FTL 14, at step 604, creates at least one data structure 402 associated with at least one logical page of a solid state memory 106. The logical page is associated with at least one physical page in a data block of the solid state memory 106. The FTL 114, at step 606, stores a first set of information 404 associated with the logical page in the data structure 402. The FTL 114, at step 608, stores a second set of information 420 associated with the physical page in the data structure 402. The FTL 114, at step 610, stores at least versioning information within the second set of information 420 identifying which version of the logical page is represented by a dataset is stored within the physical page. The control flow then exits at step 612.

Figure 7:
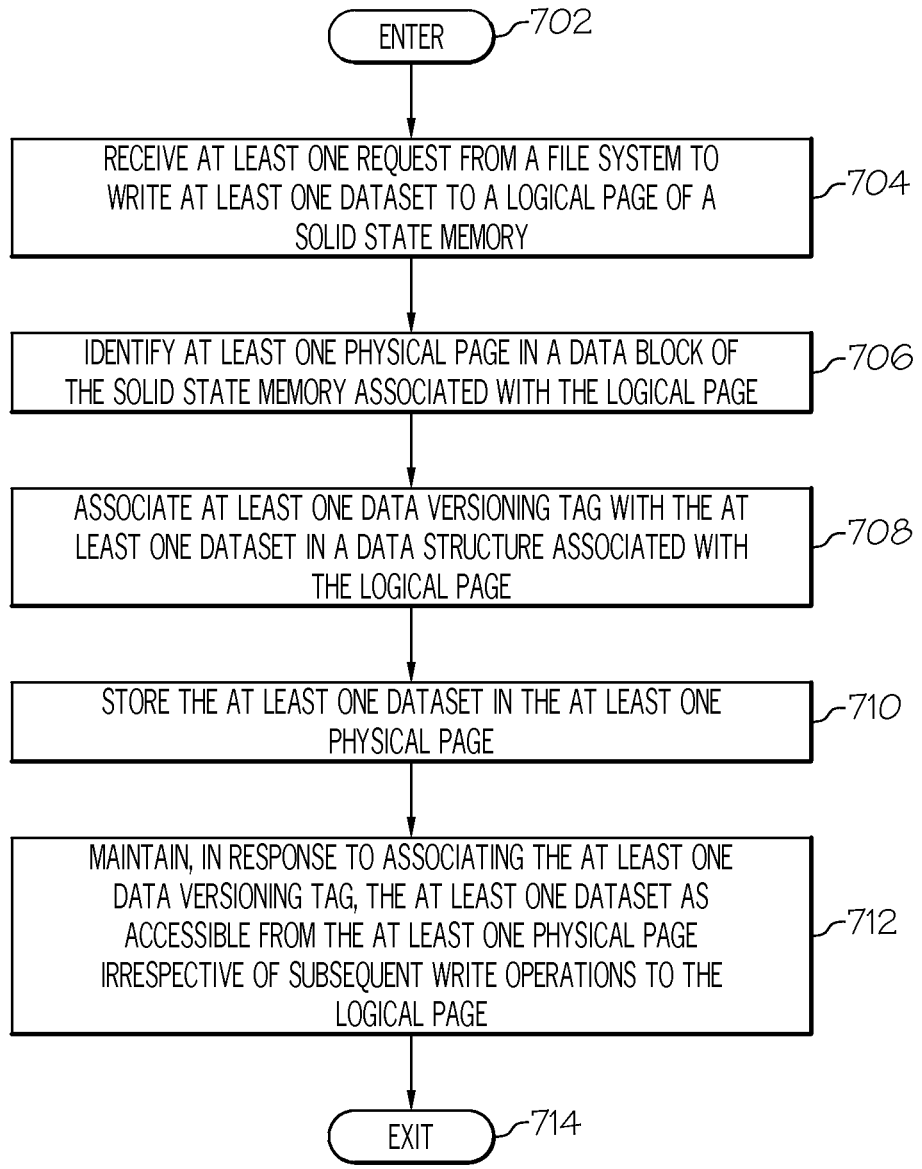
FIG. 7 is an operational flow diagram illustrating one example of a flash translation layer storing a given version of data within a solid state memory according to one embodiment of the present invention.

FIG. 7 is an operational flow diagram illustrating one example of the flash translation layer 114 storing a given version of data within a solid state memory 106. It should be noted that a more detailed discussion of the process shown in FIG. 7 has been given above with respect to FIGS. 1-5. The operational flow diagram of FIG. 7 begins at step 702 and flows directly to step 704. The FTL 114, at step 704, receives at least one request from a file system 115 to write at least one dataset to a logical page of a solid state memory 106. The FTL 114, at step 706, identifies at least on physical page in a data block of the solid state memory 106 associated with the logical page.

The FTL 114, at step 708, stores the at least one dataset in the at least one physical page. The FTL 114, at step 710, associates least one data versioning tag with the at least one dataset in a data structure associated with the logical page. The at least one data versioning tag identifies the at least one dataset as a given version of the logical page. The FTL 114, at step 710, maintains, in response to associating the at least one data versioning tag, the at least one dataset as accessible from the at least one physical page irrespective of subsequent write operations to the logical page. The control flow then exits at step 714.

Figure 8:
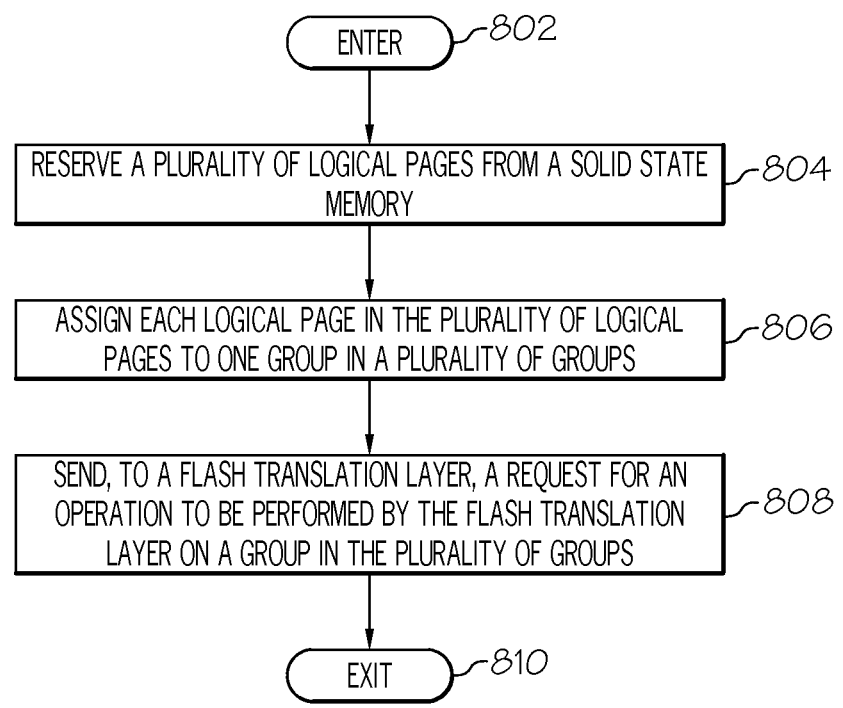
FIG. 8 is an operational flow diagram illustrating one example of a file system interacting with a flash translation in a data versioning context according to one embodiment of the present invention.

FIG. 8 is an operational flow diagram illustrating one example of a file system 115 interacting with the flash translation 114 in a data versioning context. It should be noted that a more detailed discussion of the process shown in FIG. 8 has been given above with respect to FIGS. 1-5. The operational flow diagram of FIG. 8 begins at step 802 and flows directly to step 804. The file system 115, at step 804, reserves a plurality of logical pages from a solid state memory. Each logical page in the plurality of logical pages is associated with a plurality of physical pages in the solid state memory. The file system 115, at step 806, assigns each logical page in the plurality of logical pages to one group in a plurality of groups. The file system 115, at step 808, sends a request to the FTL 114 for an operation to be performed by the FTL 114 on a group in the plurality of groups. The control flow then exits at step 810.

Figure 9:
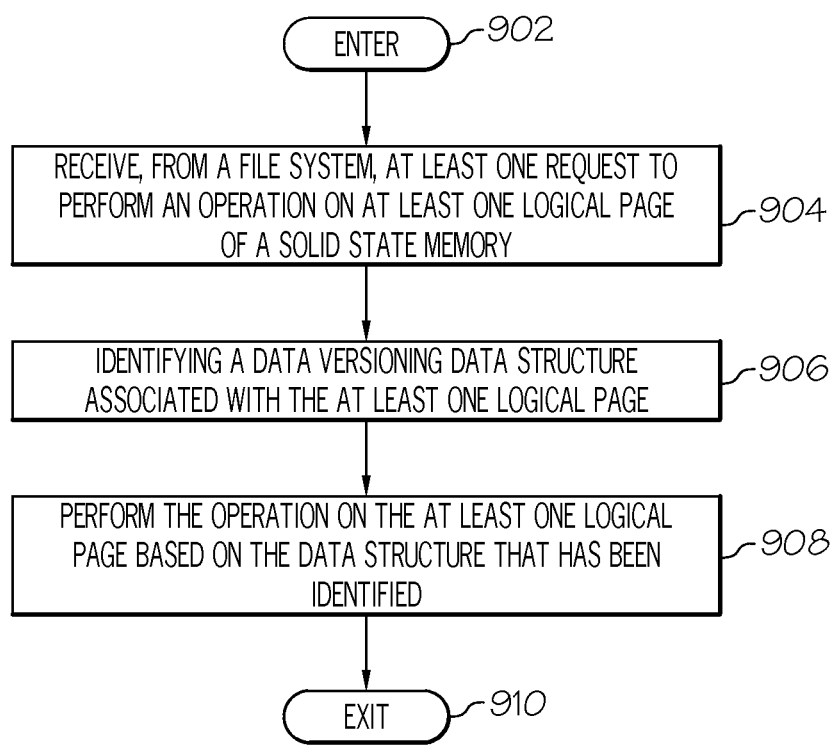
FIG. 9 is an operational flow diagram illustrating one example of a flash translation layer interacting with a file system for performing operations on versions of data within a solid state memory according to one embodiment of the present invention.

FIG. 9 is an operational flow diagram illustrating one example of the flash translation layer 114 interacting with a file system 115 for performing operations on versions of data within a solid state memory 106. It should be noted that a more detailed discussion of the process shown in FIG. 9 has been given above with respect to FIGS. 1-5. The operational flow diagram of FIG. 8 begins at step 902 and flows directly to step 904. The FTL 114, at step 904, receives, from a file system 115, at least one request to perform an operation on at least one logical page of a solid state memory. The FTL 114, at step 906, identifies a data structure associated with the at least one logical page. The data structure at least identifies one or more physical pages associated with the at least one logical page, and a version of the at least one logical page represented by a dataset stored in each of the one or more physical pages. The FTL 114, at step 908, performs the operation on the at least one logical page based on the data structure that has been identified. The control flow then exits at step 910.

Information Processing System

Figure 10:
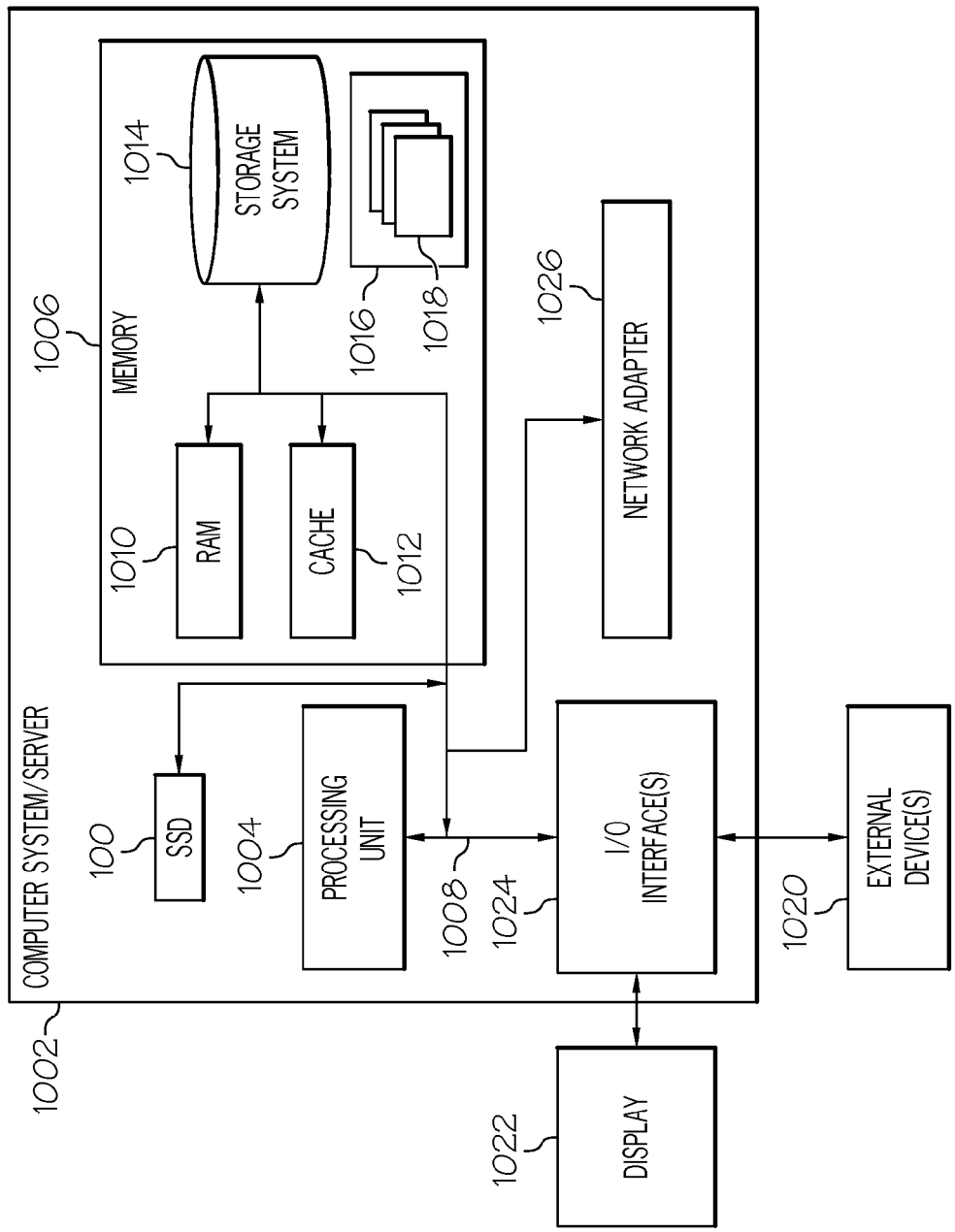
FIG. 10 illustrates one example of an information processing system according to one embodiment of the present invention.

FIG. 10 shows a schematic of one example of an information processing system 1002. Information processing system 1002 is only one example of a suitable system and is not intended to suggest any limitation as to the scope of use or functionality of embodiments of the invention described herein. Regardless, the information processing system 1002 is capable of being implemented and/or performing any of the functionality set forth hereinabove.

The information processing system 1002 can be a personal computer system, a server computer system, a thin client, a thick client, a hand-held or laptop device, a tablet computing device, a multiprocessor system, a microprocessor-based system, a set top box, a programmable consumer electronic, a network PC, a minicomputer system, a mainframe computer system, a distributed cloud computing system, or the like.

As illustrated in FIG. 10, the information processing system 1002 is shown in the form of a general-purpose computing device. The components of the information processing system 1002 can include, but are not limited to, one or more processors or processing units 1004, a system memory 1006, and a bus 10010 that couples various system components including the system memory 1006 to the processor 1004.

The bus 1008 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The information processing system 1002 typically includes a variety of computer system readable media. Such media may be any available media that is accessible by the information processing system 1002, and it includes both volatile and non-volatile media, removable and non-removable media.

The system memory 1006 can include computer system readable media in the form of volatile memory, such as random access memory (RAM) 1010 and/or cache memory 1012. The information processing system 1002 can further include other removable/non-removable, volatile/non-volatile computer system storage media. By way of example only, a storage system 1014 can be provided for reading from and writing to a non-removable or removable, non-volatile media such as one or more solid state disks 100 and/or magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus 1008 by one or more data media interfaces. As will be further depicted and described below, the memory 1006 may include at least one program product having a set (e.g., at least one) of program modules that are configured to carry out the functions of various embodiments of the invention.

Program/utility 1016, having a set (at least one) of program modules 1018, may be stored in memory 1006 by way of example, and not limitation, as well as an operating system, one or more application programs, other program modules, and program data. Each of the operating system, one or more application programs, other program modules, and program data or some combination thereof, may include an implementation of a networking environment. Program modules 1018 generally carry out the functions and/or methodologies of various embodiments of the invention as described herein.

The information processing system 1002 can also communicate with one or more external devices 1020 such as a keyboard, a pointing device, a display 1022, etc.; one or more devices that enable a user to interact with the information processing system 1002; and/or any devices (e.g., network card, modem, etc.) that enable computer system/server 1002 to communicate with one or more other computing devices. Such communication can occur via I/O interfaces 1024. Still yet, the information processing system 1002 can communicate with one or more networks such as a local area network (LAN), a general wide area network (WAN), and/or a public network (e.g., the Internet) via network adapter 1026. As depicted, the network adapter 1026 communicates with the other components of information processing system 1002 via the bus 1008. It should be understood that although not shown, other hardware and/or software components could be used in conjunction with the information processing system 1002. Examples, include, but are not limited to: microcode, device drivers, redundant processing units, external disk drive arrays, RAID systems, tape drives, and data archival storage systems, etc.

Non-Limiting Examples

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been discussed above with reference to flowchart illustrations and/or block diagrams of methods, apparatus (systems) and computer program products according to various embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for maintaining versions of data within a solid state memory, the method comprising:
receiving, by a flash translation layer, at least one read request from a file system to perform a read operation, the read operation configured to read at least one dataset from at least one physical page associated with a logical page of a solid state memory, the at least one read request identifying the logical page;
identifying at least one physical page associated with the logical page;
retrieving a dataset from the physical page;
retrieving a data versioning tag associated with the dataset from a tag area within the flash translation layer, the data versioning tag comprising at least
a version identifier identifying the dataset as a given version of a dataset associated with the at least one logical page, and a file/directory identifier identifying one of a file and a directory within the file system corresponding to the physical page from which the dataset was retrieved, where physical pages corresponding to one of a given file and a given directory are associated with a same file/directory identifier; and sending the dataset and the data versioning tag to the file system.

2. The method of claim 1, wherein the data versioning tag further comprises a group identifier associated with the logical page and the physical page, the group identifier being assigned by the file system to a collection of logical pages and their physical pages including the logical page and the physical page independent of an operation associated with therewith, the group identifier further identifying one of an inode, indirect block, data file/directory, and special file/directory of the file system associated with the collection of logical pages and their physical pages.

3. The method of claim of 1, wherein the file/directory is further associated with the logical page.

4. The method of claim 1, wherein identifying the at least one physical page comprises:

analyzing a logical-to-physical translation table associated with the solid state memory; and identifying, based on the analyzing, an entry within the logical-to-physical translation table associated with the logical page.

5. The method of claim 4, wherein the associating further comprises:

identifying, a data structure pointer stored within the entry, wherein the data structure pointer identifies a location within the tag area comprising the data versioning tag.

* * * * *